United States Patent
Kuksenkov et al.

(10) Patent No.: US 6,625,182 B1
(45) Date of Patent: Sep. 23, 2003

(54) SEMICONDUCTOR OR SOLID-STATE LASER HAVING AN EXTERNAL FIBER CAVITY

(75) Inventors: Dmitri V. Kuksenkov, Painted Post, NY (US); John D. Minelly, Painted Post, NY (US); Luis A. Zenteno, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/553,716

(22) Filed: Apr. 20, 2000

(51) Int. Cl.$^7$ .................. H01S 3/098; H01S 3/091; H01S 3/08
(52) U.S. Cl. .................. 372/19; 372/75; 372/102
(58) Field of Search .................. 372/19, 75, 43, 372/9, 39, 102, 6

(56) References Cited

U.S. PATENT DOCUMENTS

| | | | |
|---|---|---|---|
| 5,050,179 A | | 9/1991 | Mooradian .................. 372/44 |
| 5,305,336 A | * | 4/1994 | Adar et al. .................. 372/18 |
| 5,323,416 A | * | 6/1994 | Bhat et al. .................. 372/99 |
| 5,422,897 A | | 6/1995 | Wyatt et al. .................. 372/6 |
| RE35,215 E | * | 4/1996 | Waarts et al. .................. 372/108 |
| 5,513,196 A | | 4/1996 | Bischel et al. .................. 372/22 |
| 5,555,253 A | * | 9/1996 | Dixon .................. 372/29 |
| 5,627,853 A | | 5/1997 | Mooradian et al. .................. 372/92 |
| 5,715,263 A | | 2/1998 | Ventrudo et al. .................. 372/6 |
| 5,717,711 A | * | 2/1998 | Doussiere et al. .................. 372/102 |
| 5,774,484 A | | 6/1998 | Wyatt et al. .................. 372/6 |

(List continued on next page.)

OTHER PUBLICATIONS

Kuksenkov et al., "Measurement of internal quantum efficiency and losses in vertical cavity surface emitting lasers," *Applied Physics Letters*, vol. 66, No. 14, Apr. 3, 1995, pp. 1720–1722.

Kutznetsov et a., "High–power (>0.5–W CW) diode–pumped vertical–external–cavity surface–emitting semiconductor lasers with circular TEM$_{00}$ beams," *IEEE Photonics Technology Letters*, vol. 9, No. 8, Aug. 1997, pp. 1063–1065.

*Primary Examiner*—Paul Ip
*Assistant Examiner*—James Menefee
(74) *Attorney, Agent, or Firm*—Juliana Agon

(57) ABSTRACT

A semiconductor laser having an external cavity including a single-mode optical fiber. A Bragg grating is written onto the fiber which defines the end of the optical cavity, selects the lasing wavelength, and discriminates against the lasing of higher-order transverse modes in the multi-mode gain region. In one embodiment, the semiconductor laser includes an optically active vertical-cavity semiconductor stack similar to a vertical-cavity surface emitting laser. The stack is optically pumped either from the front or the back over a relatively large area such a multi-mode beam is output. Optics couple the multi-mode beam to the single-mode input of the fiber. A partially transmissive mirror of reflectivity between 25 and 40% may be placed on the output surface of the semiconductor stack to form a coupled-cavity laser. A plurality of laser diodes can be angularly positioned around the area of the semiconductor stack being pumped to increase the total pump power. In a second embodiment, the semiconductor laser includes a broad-area diode laser/amplifier. Anamorphic optics couple the asymmetric output of the optical diode to the single-mode fiber. In a third embodiment, a laser diode pumps a solid-state rod composed of an optically active material such as YAG. One end of the rod is coated with a mirror, and the other end is optically coupled to the single-mode fiber having the Bragg grating written thereon. The invention can be advantageously used to optically pump an erbium-doped fiber amplifier.

35 Claims, 5 Drawing Sheets

U.S. PATENT DOCUMENTS

| | | | |
|---|---|---|---|
| 5,870,417 A | * 2/1999 | Verdiell et al. | 372/32 |
| 5,914,972 A | 6/1999 | Siala et al. | 372/33 |
| 5,914,976 A | * 6/1999 | Jayaraman et al. | 372/50 |
| 6,058,128 A | * 5/2000 | Ventrudo | 372/96 |
| 6,108,478 A | * 8/2000 | Harpin et al. | 385/129 |
| 6,125,222 A | 9/2000 | Anthon | 385/33 |
| 6,188,705 B1 | * 2/2001 | Krainak et al. | 372/32 |
| 6,192,177 B1 | * 2/2001 | Amundson et al. | 385/37 |
| 6,226,311 B1 | * 5/2001 | Meliga et al. | 372/102 |
| 6,246,512 B1 | * 6/2001 | Kakui | 359/337 |
| 6,263,002 B1 | * 7/2001 | Hsu et al. | 372/6 |
| 6,278,721 B1 | * 8/2001 | Joyce | 372/102 |
| 6,327,293 B1 | * 12/2001 | Salokatve et al. | 372/96 |

* cited by examiner

SEMICONDUCTOR OR SOLID-STATE LASER HAVING AN EXTERNAL FIBER CAVITY

BACKGROUND OF THE INVENTION

1. Field of The Invention

The invention relates generally to semiconductor lasers. In particular, the invention relates to a laser having a resonant cavity including both a semiconductor amplifier and an optical fiber upon which is written a Bragg grating providing the frequency and mode discrimination of the laser.

2. Technical Background

Optical amplifiers, in particular doped fiber amplifiers, have become increasingly incorporated into the backbone of the telecommunications network when it is necessary to amplify optical signals without the need to first reconvert them to electrical form. Instead, the optical signal itself is amplified regardless of its coding format. As illustrated schematically in FIG. 1, a digital optical signal being transmitted across the telecommunications network is received on a single-mode optical fiber 10 and is combined in an optical combiner 12 with an optical pump signal from an optical pump source 14. The combined signals traverse an optical amplifier 16, preferably constituted of an erbium-doped fiber amplifier (EDFA), that is, a silica fiber doped with optically active erbium ions $Er^{3+}$. In an EDFA, an optical pump signal excites the erbium ions, which can then amplify another optical signal at a lower frequency than the pump frequency. In a telecommunications system, the pump signal amplifies the input data signal, and the EDFA outputs the amplified data signal to a single-mode output fiber 18. Other configurations are possible, for example, the data and pump signal may counter-propagate, and further components such as isolators and stabilization circuits may be included. These variations are not important to the invention and will not be further discussed.

For optical communications, the optical carrier for data signals is typically in the 1300 to 1350 nm or 1525 to 1610 nm ranges while the pump signal is advantageously in the 950 to 1000 nm range, but other wavelength ranges are possible.

For long-range transmission, it is greatly desired that not only the transmission fibers 10, 18 be single mode but that the elements associated with the EDFA 16 also be single mode so as to maintain the integrity of the data signal being amplified. In particular, it is advantageous that a single-mode fiber 19 link the optical pump source 14 and the optical combiner 12 and other parts of the EDFA.

Modern optical fiber communication systems have placed increasingly difficult requirements on the systems illustrated in FIG. 1, in particular the need for increasing levels of amplification. Not unexpectedly, it is desired to amplify a single optical signal as much as possible so as to maximize the distance between required amplification stations. Not so apparent is the increased power requirement necessitated by wavelength division multiplexing (WDM). In this fiber optic transmission technology, a number of closely space optical channels carry different data channels and are simultaneously amplified by the single EDFA 16. The number of WDM channels is increasing from 4 and 16 to 64 and considerably beyond. Each of the multiple channels requires its own fraction of optical pump power. Furthermore, for channel separation, high data rates, and efficiency, it is greatly desired that the data signal be carried only on a single-mode fiber and be combined with a pump signal carried on a single mode fiber. That is, the optical pump source 14 is being expected to provide ever higher amounts of optical power while maintaining its single-mode characteristics.

The prevalent types of single-mode fiber (SMF) systems include semiconductor laser sources based on either narrow single-stripe laser diodes or flared master oscillator-power amplifier (MOPA) configurations. Single-stripe lasers have been reported with output powers of 700 mW, and MOPA with output powers in excess of 1 W. The best currently commercially available SMF coupled pump source provide only about 200 mW of optical pump power at 980 nm. The apparent reasons for this low number include stability and reliability problems produced by the very high optical power densities on the laser mirrors.

A broad-area laser diode has a width considerably larger than that associated with single-mode operation, for example, a stripe width of 100 µm, so that broad-area laser diodes produce multi-moded optical outputs. Their large size allows them to generate higher optical power while still operating at a fairly low power density. However, it is extremely difficult to achieve stable operation with a fundamental (zero-order) transverse mode, the mode of use in pumping a single-mode fiber amplifier. Adequate mode selectivity can be achieved with a narrow slit and an external mirror defining one end of the cavity. However, stability is achieved only by the continued precise alignment of the external elements.

Another approach in the design of high-power lasers uses a multiple quantum-well (MQW) structure in a surface-emitting configuration (that is, a vertical-cavity surface-emitting laser, VCSEL) with an external spherical mirror defining one end of the cavity. This approach produces high performance, but the alignment of the external mirror must be precisely maintained, and at higher pump power the mode selectivity may not be strong enough to ensure operation only in the zero-order mode. These structures typically rely upon either semiconductor interference mirrors formed on a face of the VCSEL or upon the length of the vertical optical cavity formed on the chip to provide the frequency discrimination required of a laser. Such mirrors, particularly when formed of semiconductors, require a large number of layers whose thicknesses must be precisely controlled, contributing to both increased cost and optical loss. Frequency-discrimination based upon cavity length of a semiconductor structure introduces large thermal drift in the lasing frequency because of the large thermal dependence of the effective dielectric constants in semiconductors.

All these solutions further do not effectively address the added problem of coupling the lasing light into a single-mode optical fiber, as required for many applications including the preferred optical pump source for an EDFA.

SUMMARY OF THE INVENTION

The invention includes a semiconductor optical amplifier coupled to a single-mode optical fiber upon which is written a Bragg grating having a period corresponding to the desired lasing wavelength. The Bragg grating defines one end, preferably the output end, of an optical cavity which includes the semiconductor amplifier.

The semiconductor laser of the invention is advantageously used as an optical pump source for a doped fiber amplifier, such as an erbium-doped fiber amplifier requiring pump light around 980 nm.

In one set of embodiments of the invention, the semiconductor amplifier includes a wide-area stacked structures of semiconductor layers generally corresponding to the structure of a vertical-cavity surface-emitting laser. Preferably, the active region includes a plurality of strained quantum wells spaced at the nodes the desired lasing wavelength.

The semiconductor stack can be optically pumped either from the front side or the back side.

A plurality of optical pump sources can be directed at inclined angles toward the beam area of the semiconductor stack.

Advantageously, a partially transmissive mirror may be coated on the side of the semiconductor stack facing the fiber so as to create a coupled cavity laser in which the amplification occurs in one cavity and the wavelength selection predominantly occurs in the other cavity.

In another set of embodiments of the invention, the semiconductor amplifier includes an edge-emitting diode laser operating as an amplifier with a mirror on one side and which is electrically pumped.

In yet a further set of embodiments, the optical amplifier includes an solid-state laser rod optically pumped by a diode laser.

DETAILED DESCRIPTION OF THE PREFERRED EMBODIMENTS

A Bragg grating written into a single-mode optical fiber (that is, a fiber Bragg grating—FBG) can be used as a frequency-discriminating and mode-discriminating mirror defining one end of an optical cavity including a large area optical gain region and optics coupling the multi-mode optical gain region and the single-mode fiber. The fiber, unlike an erbium-doped fiber amplifier, is undoped and is not optically active. The single-mode fiber can be directly and efficiently coupled to a single-mode fiber receiving the output of the laser system. The invention is applicable to both optically and electrically pumped semiconductor lasers.

Figure 2:
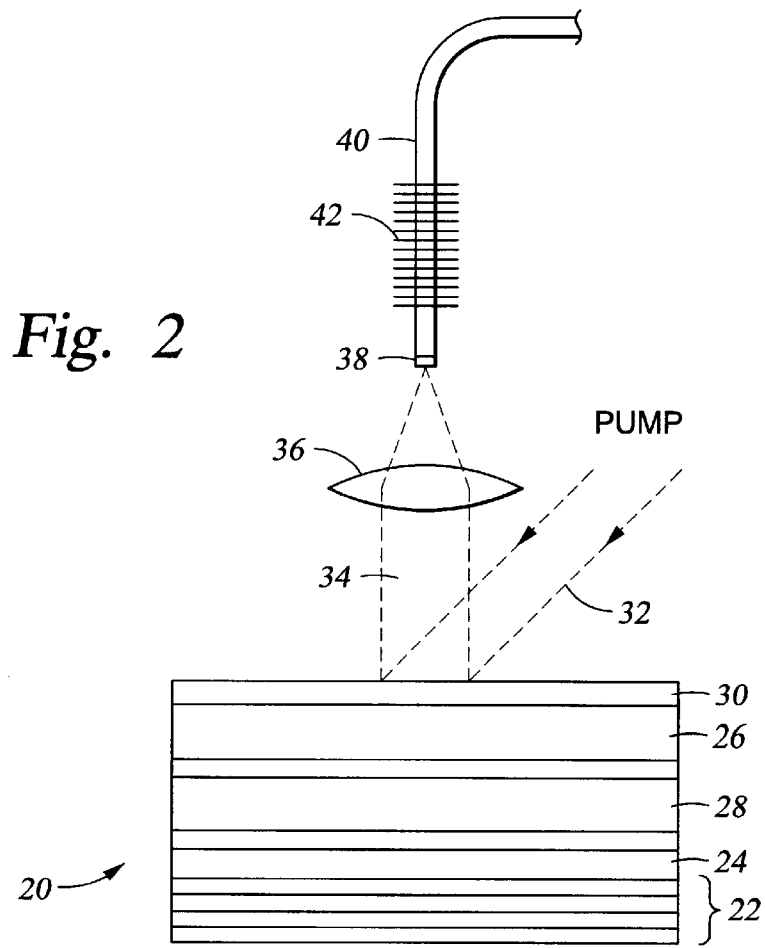
FIG. 2 is a schematic, cross-sectional view of a first embodiment of the invention that is optically pumped from the front surface of the semiconductor stack.

A first embodiment of the invention illustrated in the schematic cross-sectional view of FIG. 2 uses top-surface optical pumping of a vertically arranged optical-gain structure 20, hereafter referred to as the semiconductor stack 20. Advantageously, the semiconductor stack 20 has large lateral dimensions, typically of the order of at least 100 $\mu$m up to a few millimeters allowing the generation of large amount of laser power at relatively low power densities. A variety of solid-state materials, prepared in the form of a relatively thin disk or layer, can be used for the active part of the semiconductor stack 10. For use as a pump source for an EDFA, the operating wavelength needs to be near 980 nm. The preferred structure of the stack at this time for this spectral range includes strained multiple quantum wells (MQWs) of InGaAs/GaAs. This structure is typically epitaxially grown on a GaAs substrate to produce, as shown schematically in FIG. 2, a bottom interference mirror 22, spacers 24, 26, and an active region 28 sandwiched between the spacers 24, 26. A more detailed vertical structure will be discussed later with reference to FIG. 3. Because the structure 10 is optically pumped and being essentially undoped, does not involve a p-n junction, the active region 28 can be made relatively thick. The semiconductor stack 20 is coated with an anti-reflection coating 30, as is well known in such vertical structures.

The active region 28 of the semiconductor stack 20 is optically pumped by one or more pump beams 32 obliquely oriented with respect to the normal of the semiconductor stack 20, for example, at an angle of 45°. The diameter of the pump beam 32 is made relatively large, for example, the 100 :m to 3 mm of the semiconductor stack 20 to allow optical generation in the larger volume of the optical gain structure 20. A 100 :m spot size is approximately optimized for a 2 W optical pump. Such widths are substantially greater than the lateral dimensions associated with confined radiation having a single transverse mode. It is noted that because of the higher refractive index inside the semiconductor stack 20, the pump beam 32 produces a somewhat more vertically oriented beam inside the stack 20. However, because the width of the pump beams 32 is usually considerably larger than the depth of interaction within the semiconductor stack 10, the beam inclination assumes little significance beyond surface reflection coefficients and beam ellipticity. For generating 980 nm light in InGaAs MQWs, the pump light should be in the range of 800 to 850 nm. Intense optical diode laser bars emitting at 808 nm are commercially available for use in pumping solid-state lasers and can be easily adapted for pumping the semiconductor lasers of the invention.

The intense light from the optical pump beam 32 causes the active region 28 to emit light in an optical band near 980 nm. The emitted light is strongly reflected by the back mirror 22 but is efficiently transmitted through the anti-reflection coating 30 into a forward directed beam 34.

A lens system 36 focuses the output beam 34 onto an input end 38 of a single-mode optical fiber 40. The lens system 36, which in this embodiment may be composed of one or more simple lenses, reduces the size of the beam 34 from the multi-moded width of the pumped region of the semiconductor stack 20 to a single-moded width associated with the single-mode optical fiber 40 as well as taking into account the beam divergences associated with both.

The single-mode optical fiber 40 is typically composed of silica materials. Such a fiber 40 is closely related to single-mode optical fibers extensively used in communications networks. The diameter of its circular core is sufficiently small, on the order of 4 to 6 $\mu$m, to support only a single transverse mode. However, more complex fiber structures, such as a graded core-cladding, are possible.

According to the invention, a fiber Bragg grating (FBG) 42 is written into the fiber 40 close to its input end 38. The grating 42 is only schematically illustrated in FIG. 2. Its size and location and possible multiplicity of gratings are not limited by the illustration. It is well known how to write the Bragg grating into silica fiber by exposing the fiber to ultraviolet light through an appropriate mask. The periodicity of the fiber Bragg grating 42 causes it to serve as a wavelength selector since the grating periodicity causes a narrowly defined band of wavelengths to be reflected back toward the semiconductor stack 20. Other wavelengths are transmitted through the grating 42. The light reflected back to the semiconductor stack 20 has a total round trip gain less loss of greater than unity, thereby permitting it to self-amplify. The optical signal becomes coherent as it intensifies, and upon stable lasing gain and loss are exactly equal. As is well known, the gain in a lasing structure is concentrated in the optical mode having a wavelength with the least loss. Thereby, the fiber Bragg grating 42 defines the lasing wavelength $\lambda_L$ or equivalently the lasing frequency of the semiconductor laser of FIG. 2. A fiber Bragg grating has at least two advantages. It requires only minimal optical alignment, and its thermal sensitivity is low.

Furthermore, the Bragg grating 42 is written on a single-mode fiber 40 which will support only a single optical mode. In fact, there are two degenerate fundamental modes in the circular geometry assumed for the fiber 40, but these can be considered to be a single mode of indeterminate polarization unless other means are used to suppress one of the two orthogonal fundamental modes. Thereby, the single-mode Bragg grating 42 discriminates against lasing of higher-order transverse modes.

Figure 1:
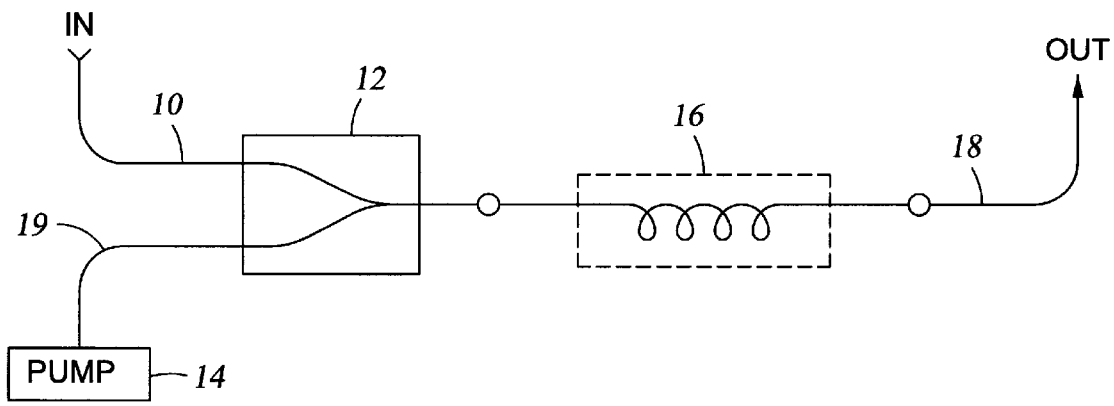
FIG. 1 is a schematic diagram of fiber communication network including an erbium-doped fiber amplifier with which the semiconductor laser of the invention can be used.

The Bragg grating 42, however, is not 100% reflective at its center wavelength $\lambda_L$, a 90% reflectivity being typical. A small fraction of the lasing light is transmitted through the partially transmissive Bragg grating 42 to form the laser output beam. An advantage of the Bragg grating 42 being written into the single-mode fiber 40 is that the entire optical output of the laser is already impressed on a single-mode fiber 40. This fiber 40 can either be directly used as the pump input fiber 19 in the EDFA of FIG. 1, or alternatively a highly efficient splice may be made between the single-mode pump fiber 40 of FIG. 2 and another single-mode fiber used for routing the 980 nm pump signal.

Thus, the fiber Bragg grating 42 simultaneously achieves three advantages. It serves as a thermally insensitive wavelength selector. It suppresses all but the zero-order transverse modes. Its lasing output is already carried on a single-mode fiber.

Figure 3:
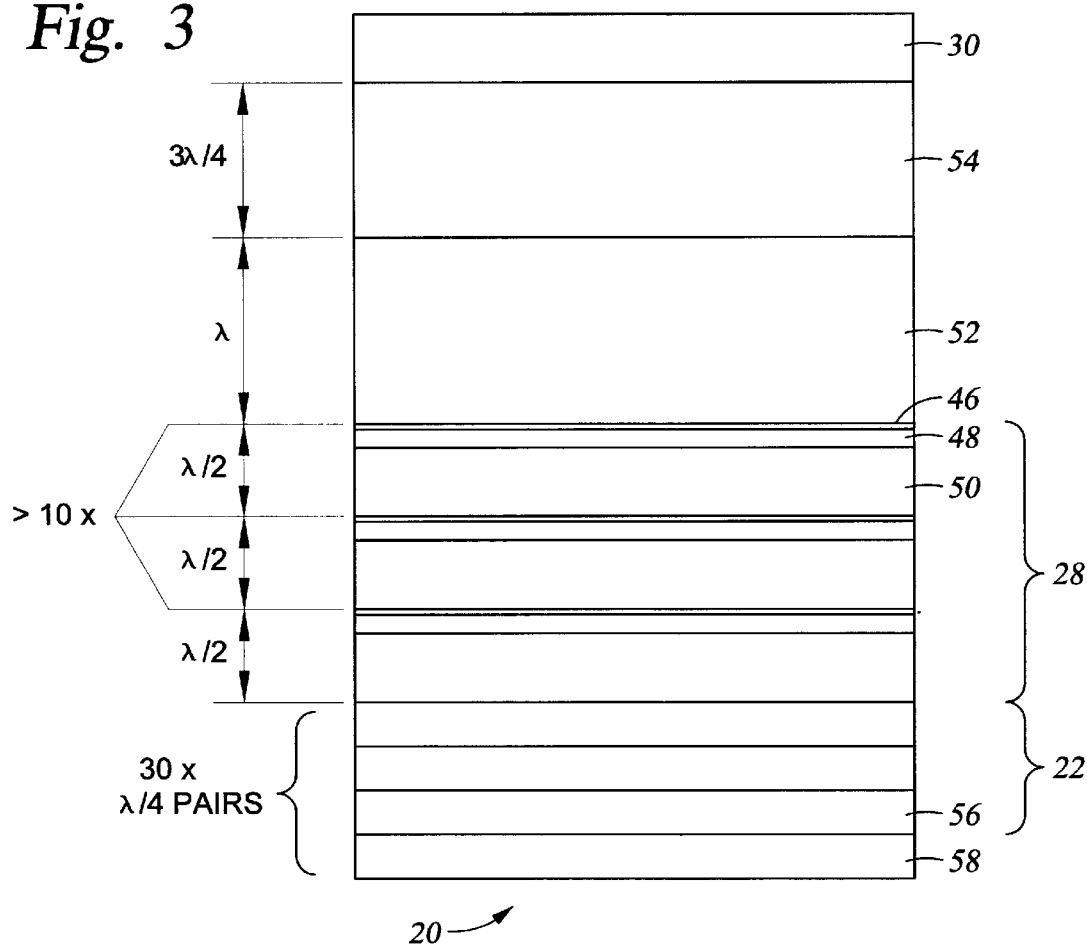
FIG. 3 is a cross-sectional view of an example of the semiconductor stack of FIG. 2.

A detailed example of the vertical structure of the semiconductor stack 20 providing the required optical gain is illustrated in FIG. 3. The active region 28 includes a large odd number, preferably greater than 10, of sets of thin InGaAs strained quantum-well layers 46, relatively thin InGaP strain compensating layers 48, and relatively thick InGaAsP or AlGaAs light-absorbing layers 50. The sets of layers 46, 48, 50 are arranged on a period having an optical length of $\lambda_L/2$, where $\lambda_L$ is the desired lasing wavelength, here 980 nm. As is well known, the quantum-wall layers 46 have very small thicknesses, of the order of nanometers, and are strained to produce well defined energy levels within the quantum wells having an energy separation corresponding to the desired emission wavelength $\lambda_L$. The strain compensating layers 48 have the opposite strain so as to prevent strain from accumulating to the point that dislocations would form. The relatively thick light-absorbing layers 50 provide the desired periodicity and are made optically absorbing at the pump wavelength so that the active region 28 efficiently absorbs the pump light. Electrons and holes generated in the light-absorbing layers 50 can diffuse to the much thinner quantum-well layers 46. An additional thicker InGaAsP light-absorbing layer 52 having an optical thickness $\lambda_L$ may be grown above the active region 28. A transparent aluminum-free InGaP window layer 54 having an optical thickness of $3\lambda_L/4$ may be grown at the top of the semiconductor stack. The indicated optical thicknesses have the advantage of placing the maxima of the standing wave at the quantum wells.

The anti-reflection coating 30 is deposited over the semiconductor stack and typically includes a half-wavelength thickness of a dielectric material so as to couple light into and out of the stack 20 with reduced reflection. The anti-reflection coating is important not only on the semiconductor stack 20 but also on other components included within the semiconductor laser cavity so as to reduce the internal cavity loss. The described active region 28 produces a round-trip gain of about 0.1. A 90% reflectivity of the fiber Bragg grating 42 translates to a top mirror loss in logarithmic units of 0.053. Therefore, lasing is possible only if the total of other internal round-trip loss in the laser cavity does not exceed 0.047, including scattering, absorption, and fiber coupling.

The bottom mirror 22 may be formed of a large number, for example 30, pairs of alternating GaAs layers 56 and AlGaAs layers 58, each layer 56, 58 having an optical thickness of $\lambda_L/4$. The dielectric contrast between the large number of paired quarter-wavelength layers 56, 58 produces a semiconductor interference mirror with a reflectivity of at least 99.5% and preferably greater than 99.8%. It is typical for the illustrated structure 20, with the exception of the interference mirror 30, to be grown in a single growth cycle of epitaxial deposition upon an unillustrated GaAs wafer, for example, by chemical vapor deposition or molecular beam epitaxy. In the top-pumped embodiment of FIG. 2, the continued presence of the growth substrate presents no problem. The bottom mirror 22 need not be transparent to the pump light, and various types of thermal heat sinking may be applied to the bottom surface without regards to the pump light.

It is possible to replace the bottom semiconductor interference mirror 22 with a dielectric interference stack or, in the case of the top-pumped embodiment of FIG. 2, even a metallic mirror, for example, of silver or gold. The dielectric stack is composed of layers, for example of $SiO_2$ and $Si_3N_4$, exhibiting much higher dielectric contrast with very low optical loss and, as a result can offer reflectivities of up to 99.8% compared to about 98% for a metallic mirror. In either case of the alternative mirrors, however, the growth substrate must be at least locally removed to expose the top or bottom of the illustrated semiconductor structure.

Figure 4:
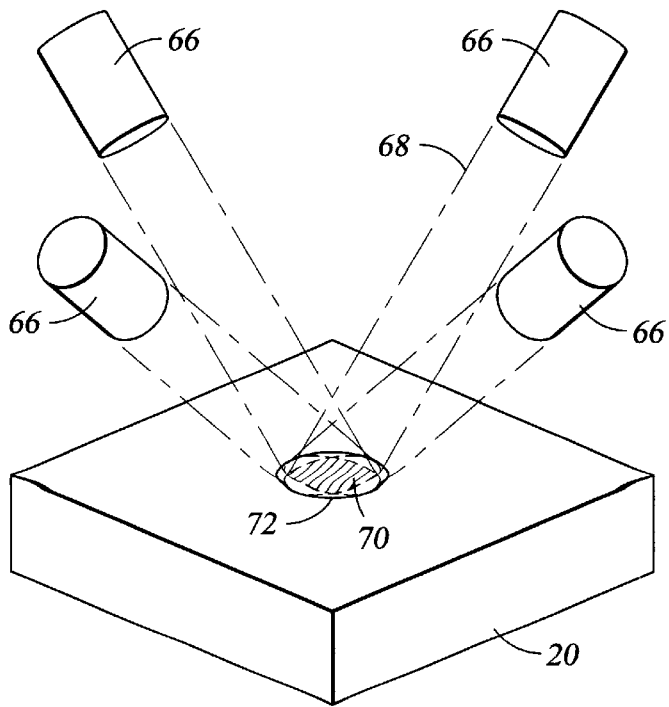
FIG. 4 is an isometric view of a multi-source embodiment of the invention.

The previously described diode lasers are currently available with optical output powers in the range of 2 W, which should be sufficient to achieve an optical output of about 700 mW in the optically pumped configuration of FIG. 2. However, the optically top-pumped configuration has the further advantage of permitting multiple angularly offset laser pump sources. As illustrated in the isometric view of FIG. 4, four laser pump sources 66 are disposed at 90° intervals about a normal to the semiconductor stack 20. They output respective pump beams 68 inclined at 45° to the surface of the semiconductor stack 20. The number of pump sources 66 may be fewer or greater depending on the power multiplication desired.

Broad-area lasers typically produce generally rectangular or asymmetrically conical optical beams. Anamorphic optics should be included within the laser pump source 66 so that all of them produce a same symmetric beam profile 70 at the surface of the semiconductor stack 20. If the diffusion of charge carriers excited by the pump beams within the semiconductor stack is taken into account, the maximum overlap between the gain and optical field profiles can be achieved if the circular gaussian pumping spot 70 is slightly smaller in size than the circular mode field 72 determined by the output beam optics 36 of FIG. 2 and is positioned at the center of the mode field 72.

If multiple pumping sources are used, they should be rotated at their respective positions to produce the same polarization direction at the surface of the semiconductor stack 20. In all cases, the displacement of the fiber Bragg grating 42 from the fiber input end 38 should not be long enough to permit significant scrambling of the polarization state of the lasing standing wave, that is, not more than several centimeters, for example, 5 cm.

On the other hand, in order to minimize power instability and noise associated with mode hopping, it is desirable to have several longitudinal modes lase simultaneously. Therefore, the wavelength spacing of the modes determined by the length of the external cavity should be smaller than the reflection bandwidth. This condition is relatively easy to satisfy, as shown by the following estimate. For a typical fiber Bragg grating having a reflection bandwidth of about 0.2 nm to have three longitudinal modes in the output spectrum, the mode spacing $\Delta\lambda$ needs to be about 0.05 nm. Including the semiconductor chip, lens, air spacing, and some length of the fiber and taking into account both the round trip and the local refractive index, the total effective cavity length $L_{\mathit{eff}}$ needs to be at least $$L_{\mathit{eff}} = \frac{\lambda_L^2}{\Delta\lambda}$$

which is about 2 cm for 0.05 nm spacing of a 980 nm signal. Thus, for a reasonable packaging scheme having an air spacing of 2 cm, the fiber Bragg grating may be placed directly adjacent (closer than 1 cm) to the cleaved end 38 of the fiber 40, which necessarily satisfies the polarization scrambling condition as well. The calculation can be somewhat generalized to require a minimum optical cavity length of 1 cm.

Figure 5:
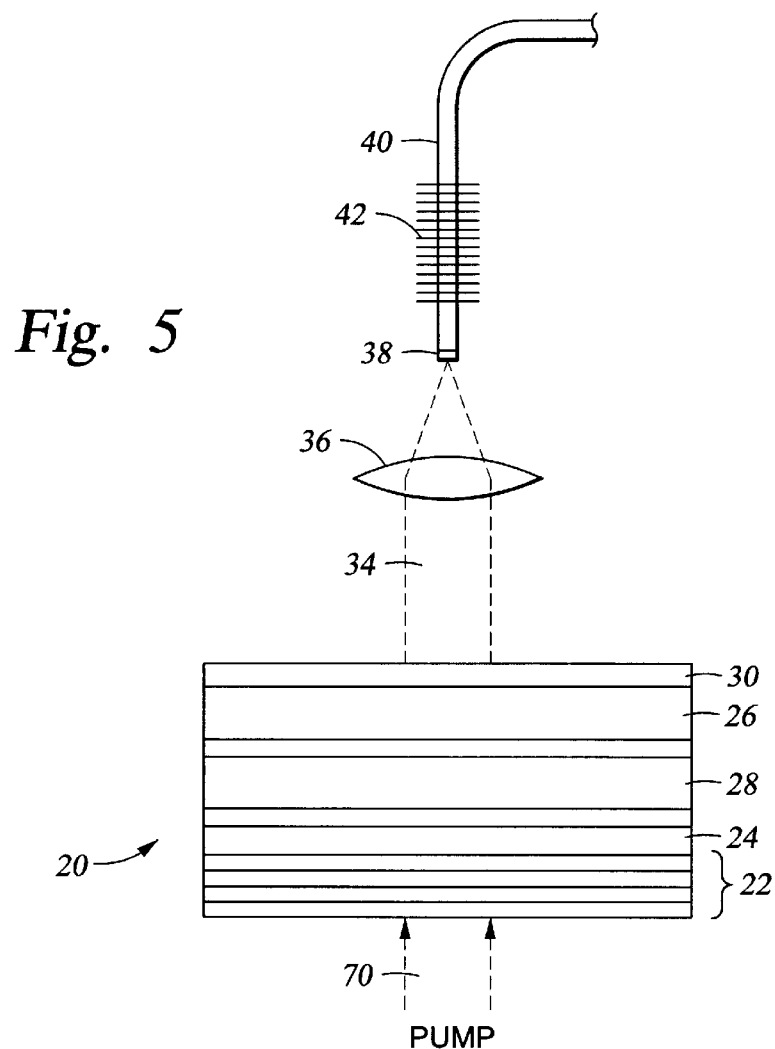
FIG. 5 is a schematic, cross-sectional view of another embodiment of the invention that is optically pumped from the back surface of the semiconductor stack.

An optically bottom-pumped embodiment of the invention is illustrated in the schematic cross-sectional view of FIG. 5. It differs primarily from the front-pumped embodiment of FIG. 2 in that its optical pump beam 70 is positioned on the side of the gain-structure 20 having the bottom mirror 22. The optical pump beam 70 may be aligned in parallel with the output beam 34. The configuration is optically and structurally simpler. However, it imposes several constraints. The bottom mirror 22 must be transmissive to the pump wavelength but highly reflective to the lasing wavelength. Therefore, a metallic bottom mirror cannot be used. Furthermore, the substrate supporting the semiconductor stack 20 and perhaps its epitaxial growth substrate needs to be considered. A GaAs substrate cannot be made transmissive at 810 nm so that, to allow a bottom window, the illustrated semiconductor stack 20 may be lifted off its growth substrate or a window may be etched in the back of the growth substrate and a dielectric window deposited in the window.

Figure 6:
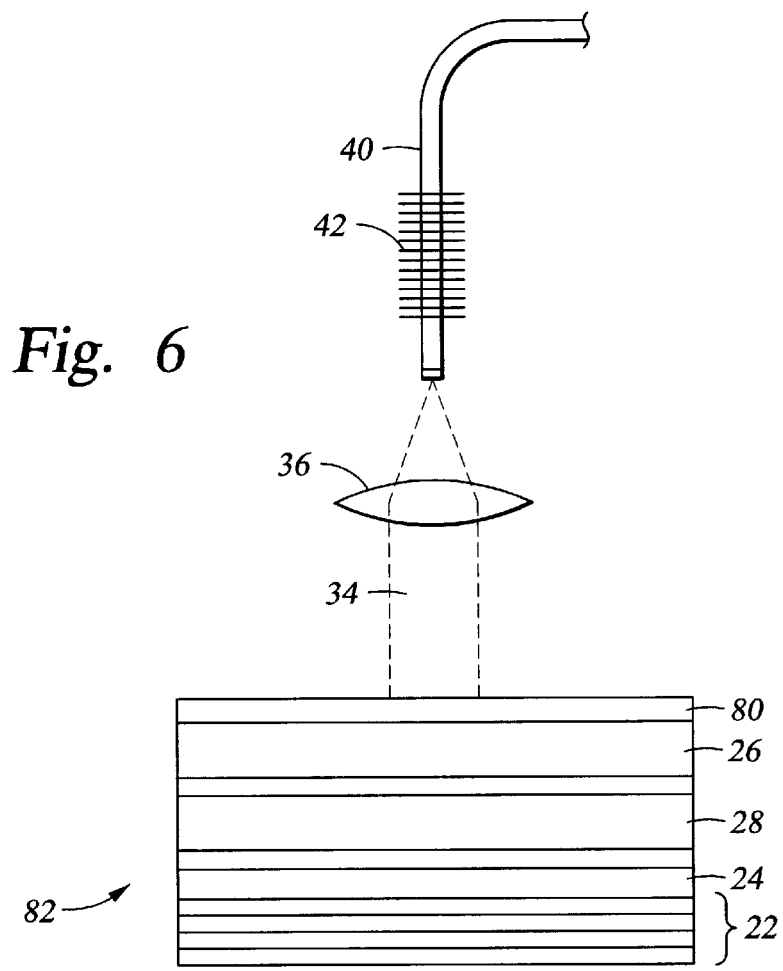
FIG. 6 is a schematic, cross-sectional view of an embodiment of the invention utilizing coupled optical cavities in the laser.

As mentioned before, the optically pumped external-cavity semiconductor laser relying upon a fiber Bragg grating requires very low cavity loss to achieve round-trip gain of greater than unity. A coupled-cavity embodiment illustrated in the schematic cross-sectional view of FIG. 6 relaxes the loss constraints. This embodiment is similar to those of FIGS. 2 and 5. However, instead of an anti-reflection coating disposed between the active region 28 and the fiber 40, a partially reflective mirror 80 is placed on the output face of the semiconductor portions of an semiconductor stack 82.

The partially reflective mirror 80 is preferably composed of a relatively few periods of a dielectric stack or of a semiconductor interference mirror grown on the semiconductor stack 82. The partially reflective mirror 80 is designed to have a significant but sub-unity reflectivity $r_s$ at the lasing wavelength $\lambda_L$. Its reflectivity $r_s$ is high enough that a significant amount of the standing wave excited by the active region 28 is reflected back towards the active region without exiting the semiconductor stack 82. However, the reflectivity is low enough that the light internally reflected from the partially reflecting mirror 80 is insufficient to support lasing. However, the wavelength-selected portions of the spectrum reflected from the fiber Bragg reflector 42 through the partially reflective mirror 80 do contribute sufficient intensity to support the lasing condition of unity gain.

The described structure is in fact a coupled cavity laser. One cavity including the semiconductor stack 20 provides the optical gain. Another cavity including the fiber Bragg grating 42 provides the frequency selection. The two cavities are partially coupled through the partially transmissive mirror 80.

Figure 7:
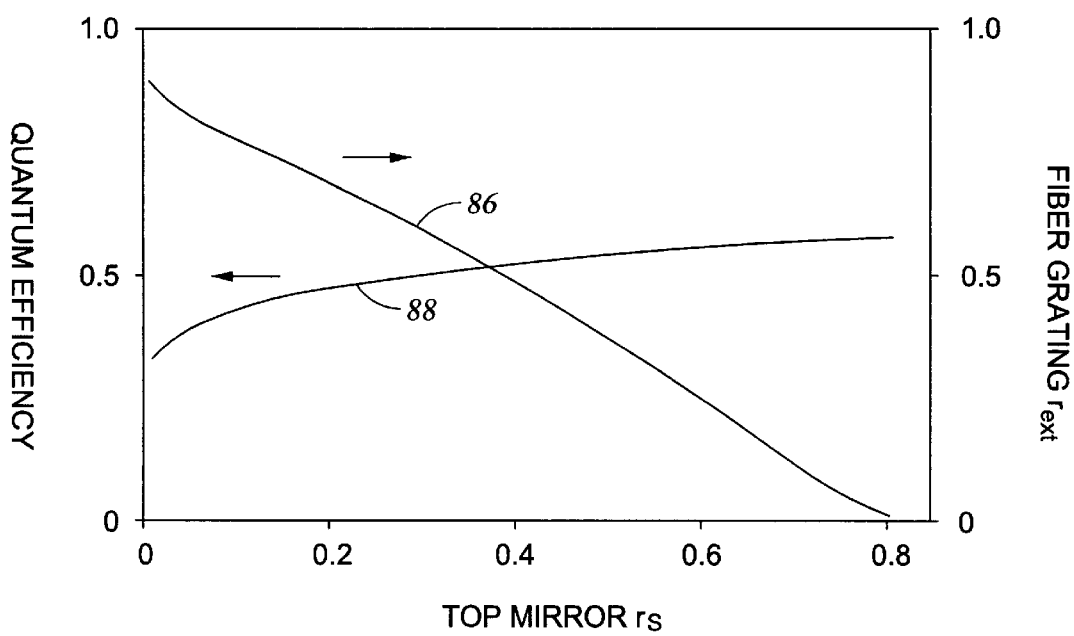
FIG. 7 is graph demonstrating the increased quantum efficiency achievable with the coupled-cavity laser of FIG. 6.

Such a partially reflective mirror also improves the quantum efficiency of the device. Calculations have been performed based upon a realistic set of parameters. First, as shown by line 86 in the graph of FIG. 7 referenced to the right ordinate, as the reflectivity $r_s$ of the top mirror 80 increases from 1% to 81%, the minimum reflectivity $r_{ext}$ of the fiber Bragg grating 42 required to achieve lasing decreases in a substantially linear fashion. For each pair of these reflectivities $r_s$, $r_{ext}$, the device output quantum efficiency was estimated, as shown by line 88. The quantum efficiency increases with increasing reflectivity $r_s$ of the top mirror 80 but quickly saturates at about 60%. A top mirror reflectivity $r_s$ of 30% increases the quantum efficiency to about 50% from a value of about 32% for no top mirror, that is, a perfect anti-reflection coating. This calculation indicates that 2 W of optical pumping power from a diode laser can produce 1 W of single-mode optical power on the fiber 40. The very high efficiency can be explained in terms of the top mirror 80 recycling part of the laser emission back to the amplifying medium without subjecting the recycled part to the relatively high loss of fiber coupling.

However, an excessively reflective top mirror 80 should be avoided. An increase of the top mirror reflectivity $r_s$ above 40% yields little improvement in quantum efficiency and is likely to degrade mode selectivity because it lowers the threshold almost equally for all transverse modes. Hence, the preferred range for top mirror reflectivity $r_s$ is between 25 and 40% at the lasing wavelength $\lambda_L$. If the device is optically pumped from the front surface, the top mirror 80 should also be substantially transparent at the pump wavelength.

It should be noted however that a significant reflection at the top mirror 80 requires that the reflection from the fiber Bragg grating 42 be spectrally matched with the internal Fabry-Perot resonance of the semiconductor stack 82. Not only should the reflectivity be near its maximum at the resonant wavelength of the semiconductor cavity, the reflection should be in phase with the resonance. These conditions are generally easily met because of the relatively broad resonance of the cavity.

The optics associated with the optically pumped embodiments can be easily accomplished with conventional A/R coated lenses, and in particular by A/R coated graded index (GRIN) lenses. So called collimators are commercially available in which a ferrule grasps the fiber and is fixed within a glass tube. A cylindrically shaped GRIN lens is also fixed within the glass tube at a fixed orientation and separation from the fiber end. Commonly known procedures are available for performing the alignment and fixing such that the optical beam on the side of the GRIN lens opposite the fiber is centered on the tube axis and has a waist at a predetermined distance from the GRIN lens. The glass tube with attached fiber and GRIN lens can then be fixed inside a larger metal tube or other support structure. The semiconductor stack is placed in the support structure at the location of the beam waist. The semiconductor stack is rotated at different inclinations to the beam axis to achieve maximum reflectance, which can be measured at the other end of the single-mode fiber bearing the Bragg grating. The semiconductor stack is then fixed at the angle producing the highest reflectance.

Thus, at each of the two alignment steps, there are only two elements, and in each step only one relative dimension or angle is being adjusted. Maintaining a precise separation between the fiber or GRIN lens and the semiconductor stack structure or its front mirror is not critical because, as was explained above, the laser is designed to have a relatively long external cavity so as to emit several longitudinal modes.

In the above embodiments, one or more light sources optically pump the semiconductor stack, which is essentially undoped. It is well known to fabricate such a stack as a electrically driven vertical-cavity surface-emitting diode laser, and this design could be changed to an optical amplifier usable with the invention by doping the two vertical sides to opposite conductivity types, thus forming a p-n junction about the quantum wells, and by suitably changing the output mirror to an anti-reflective coating or partially transmissive mirror. However, the vertical-cavity diode configuration presents difficulties with forming a low-resistance contact over a large area.

The invention can also be advantageously applied to edge-emitting semiconductor diode lasers, particularly broad-area devices in which an active waveguide is supporting and amplifying a large number of modes. The fiber Bragg grating can be characterized as stabilizing the operation of a broad-area diode laser to its zero-order transverse mode.

Figure 8:
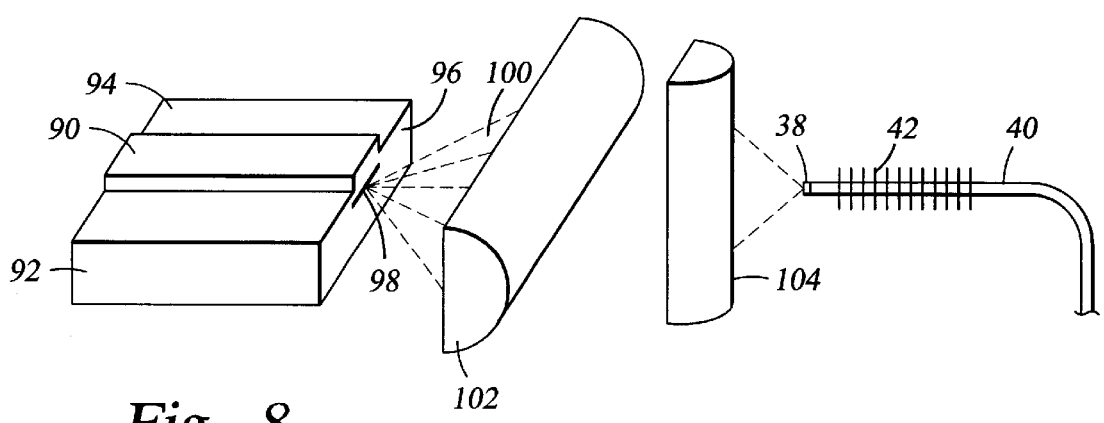
FIG. 8 is an isometric view of an embodiment of the invention using a broad-area laser diode and anamorphic optics.

A first embodiment utilizing a broad-area diode laser and anamorphic optics is illustrated in the schematic isometric view of FIG. 8. The figure illustrates a ridge waveguide diode laser having a ridge 90 formed on a substrate 92. Other edge-emitting diode laser structures, such as buried heterostructures, are more prevalent in power applications, but the ridge structure more easily illustrates the operation. The ridge 90 defines an optical waveguide underneath the ridge 90 and, through electrical contacts applied to the top of the ridge 90, also laterally defines an optical gain region. The vertical semiconductor structure below the ridge 90 includes a p-n junction and a vertical waveguiding structure. A high reflectivity coating is applied to a back facet 94. In normal edge-emitting laser diodes, a cleaved front facet 96 provides sufficient reflectance to define the end of the cavity and keep the round-trip gain equal to unity. For the present invention in which the fiber Bragg grating 42 provides the wavelength discrimination, the front facet 96 needs to be made highly transmissive, for example, by applying an anti-reflection coating onto it. Many diode waveguide lasers include a distributed Bragg grating impressed into or below the ridge 90 to define the lasing wavelength although other rely upon the shape of the gain curve of the active material. However, in the illustrated diode laser, the wavelength selection is provided by the fiber Bragg grating 42, and no significant wavelength selection occurs within the diode itself. That is, the diode itself is acting as an amplifier, not a laser, with the exception of the highly reflective mirror applied to the back facet 94.

The structure emits light from an emission area 98 on the front facet 96 below the ridge 90. In broad-area lasers, the width of the ridge 90 or other waveguide defining structure is made relatively large. The large area increases the power handling capabilities of the laser but also causes the waveguide to support numerous transverse modes. The emission area 98 has a similar width, and can emit the multiple transverse modes. On the other hand, the emission area 98 is relatively thin in the vertical direction, and its vertical emission pattern is diffraction limited. As a result, the pattern of an emission beam 100 emitted from the emission area 98 under lasing conditions is highly asymmetric and generally rectangular. In this embodiment, anamorphic optics are used to focus the emission beam 100 onto the input end 38 of the single-mode fiber 40 impressed with the fiber Bragg grating 42. The anamorphic optics must convert the large rectangular beam 100 to a small, generally symmetric beam having lateral dimensions of the order of the fiber core. The anamorphic optics may include two cylindrical lenses 102, 104 of different focal lengths and oriented perpendicularly to each other, but other types of anamorphic optics are known.

Figure 9:
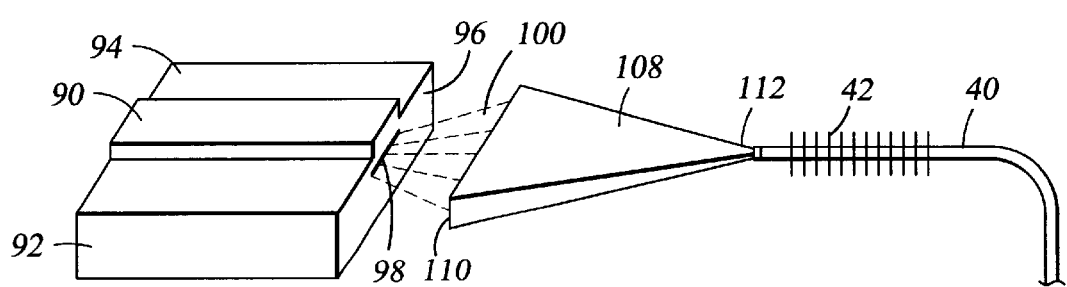
FIG. 9 is an orthographic view of another embodiment of the invention using a wide-area laser diode and a taper section on the end of the single-mode fiber.

A second embodiment utilizing a broad-area diode laser and a fiber taper is illustrated in the schematic cross-sectional view of FIG. 9. The end of the fiber 40 with the Bragg grating 42 includes an adiabatic taper section 108 having an input end 110 closely matched to the emission beam 100 from the emission area 98. Preferably, the taper section 108 has a rectangular or asymmetric pyramidal shape. Its smaller end 112 is closely matched to the single-mode input of the single-mode fiber 40. The taper is gradual enough as to be adiabatic, that is, does not mix modes but only rejects the higher-order modes which it cannot support at its narrow end.

Broad-area and other edge-emitting diode lasers typically have sufficient gain so that lasing can occur in higher-order transverse modes even without feedback from the fiber Bragg grating. To suppress the higher-order modes, additional measures are likely to be necessary. For example, the output facet may be coated with an AIR coating having an extremely low reflectivity, for example. 0.1% or less. The length of the active area of the diode laser may be made shorter than usual, for example, 100 $\mu$m or less.

If the wavelength-selected light reflected back from the fiber Bragg grating 42 is to significantly affect the gain vs. loss in the diode laser, any excess loss due to coupling optics needs to be minimized. Furthermore, the elongate emission area 98 presents a high numerical-aperture source with attendant spherical aberrations in the emission beam 100. The optics need to account for the spherical aberrations as well as to correct some of the internal astigmatism produced within the laser diode.

The invention may also be applied to solid-state lasers composed, for example, of a rod of optically active material that is optically pumped. Such optically active materials include Nd:YAG, where Nd is the optically active neodymium dopant and YAG is yttrium aluminum garnet, but other suitably doped crystals and glasses are possible for achieving different optical wavelengths. The dopant is almost always an optically active ion having a metastable excited state and which is incorporated into the host, here the YAG. When sufficiently pumped with radiation at 800 to 820 nm, Nd:YAG can be made to lase at about 1064 nm. However, solid-state rods are typically of substantial diameter, for example, a few millimeters, and thus act as multi-mode waveguides. As a result, a solid-state laser is not directly suitable as a laser driving a single-mode fiber.

Figure 10:
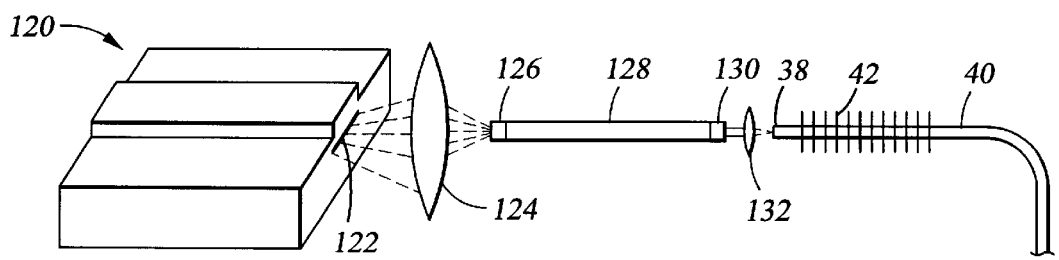
FIG. 10 is a schematic orthographic view of an embodiment of the invention using a solid-state laser rod.

An embodiment of an end-pumped solid-state laser incorporating the invention is illustrated in FIG. 10. A broad-area (alternatively called broad-stripe) diode laser 120 emits laser pump radiation from a wide emission area 122. The diode laser 120 is similar in design to the semiconductor amplifiers and lasers of the previous embodiments, but it has a semiconductor composition appropriate for emitting the desired pump wavelength. Furthermore, it is designed as a complete laser with its own end mirrors and frequency selection. Optics 124, preferably anamorphic optics, focus the pump radiation upon an input mirror 126 formed on the input end of a rod 128 of an optically active material. The input mirror 126 is designed to pass light at the pump wavelength but to be highly reflective at the lasing wavelength so as to form one end of the optical cavity. Side-pumped configurations are also possible.

The output end of the rod 128 is coated with an anti-reflective coating 130 as determined at the lasing wavelength to maximize transmission across the interface. Optics 132 focus the light from the rod 126 to the input end 38 of the single-mode optical fiber 40 written with the Bragg grating 42. The optics 132 may include free-standing lenses or graded-index (GRIN) lenses among many possibilities. An adiabatically tapered fiber input is also possible for the optics 132, but the rod size is generally too large relative to the core of a single-mode fiber.

The Bragg grating 42 defines the second end of the laser cavity and also defines the precise lasing wavelength consistent with the gain bandwidth of the active medium. It further selects only the lowest-order transverse modes for lasing within the rod 126.

The semiconductor or solid-state laser of the various embodiments of the invention presents several advantages.

The input end of the single-mode fiber effectively serves as a very efficient mode filter, thus providing strong mode selectivity. Because the fiber is a single-mode fiber, the coupling for higher-order modes is significantly less than for the zero-order mode. Consequently, the feedback provided by the fiber Bragg grating for the higher-order modes is insufficient to support lasing of those modes, at least in the optically pumped embodiments and also in well designed edge-emitting electrically pumped embodiments. The stability of single-mode operation is not degraded at higher pumping intensities, even in the presence of spatial hole burning because the modal gain for higher-order modes cannot increase enough to compensate for the higher coupling losses of those modes.

The optical alignment becomes non-critical. After initial positioning, it is not necessary to precisely maintain the distance between the fiber and the semiconductor stack, the edge-emitting laser, or the active rod since the external cavity is intentionally made long enough to support multiple longitudinal modes.

The precise lasing wavelength is determined by the Bragg grating written into the fiber although it needs to be consistent with the relatively broad gain maximum of the semiconductor chip or otherwise optically active material and, in the case of a vertical structure, correspond to the internal Fabry-Perot resonance. The fiber Bragg reflection is highly frequency selective. The gain bandwidths of optical gain media are relatively wide and can accommodate many different lasing wavelengths set by the fiber Bragg grating.

Coupling lasing light to single-mode device, such as fiber amplifiers, is greatly simplified since the laser output is already carried on a single-mode fiber.

The thermal stability is determined by the relatively thermally insensitive silica fiber, which can be further thermally isolated from the active and hot semiconductor regions or devices.

For purposes of the claims, the following points are noted. A semiconductor laser diode constitutes an optically active material because of its interaction between electrons and photons. Even an undoped semiconductor stack, particularly one incorporating quantum wells, constitutes an optically active material in which pump light excites carriers to upper levels and the carriers relax at a different wavelength. A solid-state rod acts as an active optical amplifier for light having a wavelength selected by the Bragg grating.

What is claimed:

1. A laser system comprising:
    an optically active medium having a first and a second end, the optically active medium having sufficiently large lateral dimensions to support multiple transverse lasing modes;
    a back mirror attached to said first end to reflect light at a predetermined frequency;
    a mode-discriminating front mirror comprising
        an optical fiber having a core diameter sufficiently small to support only a single fundamental zero-order transverse mode, and
        a Bragg grating written in said optical fiber partially reflecting light at said predetermined frequency; and
    fiber coupling optics coupling light from said second end of said optically active medium to said optical fiber by reducing the width of a light beam from the width corresponding to the lateral dimensions of said optically active medium to the width corresponding to the core diameter of said optical fiber and compensating for beam divergence difference;
    wherein light at said predetermined frequency lases in an optical laser cavity defined between said back mirror and said mode-discriminating front mirror, and the optical feedback from said Bragg grating discriminates against lasing of higher-order transverse modes to stabilize high power lasing only at the fundamental zero-order transverse mode, and
    wherein said fiber coupling optics comprise anamorphic optics focusing light upon an input mirror formed on an input end of a solid-state rod having an output end coated with an anti-reflective coating.

2. The laser system of claim 1, wherein said sufficiently large lateral dimensions of said optically active medium are at least 100 μm across and said optically active medium is optically pumped.

3. The laser system of claim 2, wherein said optically active medium comprises a plurality of semiconductor quantum well layers.

4. The laser system of claim 3, further comprising an anti-reflective coating on said second end of said optically active medium.

5. The laser system of claim 3, further comprising a partially transmissive mirror on said second end of said optically active medium whereby a coupled-cavity laser is formed.

6. The laser system of claim 2, wherein said optically active medium comprises a solid-state rod including optically active dopant ions.

7. The laser system of claim 1, wherein said optically active medium comprises a semiconductor edge-emitting broad-area diode.

8. The laser system of claim 1, wherein said fiber coupling optics comprise a fiber taper tapering from a multi-mode end coupled to said optically active medium to a single-mode end coupled to said single-mode optical fiber.

9. The laser system of claim 1, wherein said Bragg grating has a reflectivity of at least 90%.

10. A laser system comprising:
a mode-discriminating front mirror comprising
an optical fiber having a core diameter sufficiently small to support only a single fundamental zero-order transverse mode, and
a Bragg grating written in said optical fiber having a period corresponding to a predetermined wavelength;
a solid medium configured as a transversely multi-mode optical waveguide and comprising an optically active material;
a back mirror reflective at said predetermined wavelength coated on a first end of said optical waveguide, an optical cavity being formed between said mode-discriminating front mirror and said back mirror for lasing light at said predetermined wavelength, and the optical feedback from said Bragg grating discriminating against lasing of higher-order transverse modes to stabilize high power lasing only at the fundamental zero-order transverse mode; and
fiber coupling optics optically coupling a second end of said optical waveguide to an input end of said optical fiber by reducing the width of a light beam from the width corresponding to the lateral dimensions of said transversely multi-mode optical waveguide to the width corresponding to the core diameter of said optical fiber and compensating for beam divergence difference, and
wherein said fiber coupling optics comprises anamorphic optics focusing light upon an input mirror formed on an input end of a solid-state rod having an output end coated with an anti-reflective coating.

11. The laser system of claim 10, wherein said Bragg grating has a reflectivity of at least 90%.

12. The laser system of claim 10, wherein said fiber coupling optics comprise a tapered fiber tapering from a multi-mode end facing said multi-mode waveguide to a single-mode end adjacent said single-mode fiber.

13. The laser system of claim 10, wherein said optically active material and said waveguide structure comprise a plurality of semiconductor layers.

14. The laser system of claim 13, wherein said plurality of semiconductor layers comprise an electrically pumped diode.

15. The laser system of claim 13, wherein said plurality of semiconductor layers comprises a plurality of quantum wells.

16. The laser system of claim 15, further comprising at least one light source for optically pumping said quantum wells.

17. A semiconductor pump laser system, comprising:
an optically active semiconductor device capable of amplifying an optical signal within an optical wavelength band including a desired lasing wavelength, the optically active semiconductor device having sufficiently large lateral dimensions to provide an optical output of said semiconductor device being a transversely multi-mode output at said lasing wavelength, wherein said semiconductor device comprises an edge-emitting diode optical amplifier;
a mode-discriminating front mirror comprising
an optical fiber including an input end and having a core diameter sufficiently small to support only a single fundamental zero-order transverse mode, and
a Bragg grating written on said optical fiber having a period corresponding to said lasing wavelength, wherein an optical cavity producing light of said lasing wavelength is defined on one end by said mode-discriminating front mirror and extends within said optically active semiconductor device; and
fiber coupling optics coupling said multi-mode output of said semiconductor device to said input end of said optical fiber by reducing the width of a light beam from the width corresponding to the lateral dimensions of said optically active semiconductor device to the width corresponding to the core diameter of said optical fiber and compensating for beam divergence difference, whereby the optical feedback from said Bragg grating determines said lasing wavelength of said optically active semiconductor device and discriminates against lasing of higher-order transverse modes to stabilize high power lasing only at the fundamental zero-order transverse mode, and
wherein said fiber coupling optics comprises anamorphic optics focusing light upon an input mirror formed on an input end of a solid-state rod having an output end coated with an anti-reflective coating.

18. The laser system of claim 17, wherein said optically active semiconductor comprises a vertical-cavity semiconductor structure having lateral dimensions larger than 100 µm.

19. The laser system of claim 18, wherein said vertical-cavity semiconductor structure comprises not more than one conductivity type, thereby not containing a p-n junction.

20. The laser system of claim 18, wherein said vertical-cavity semiconductor structure includes a first end of an optical cavity and a second end of said optical cavity providing said multi-mode output of said semiconductor device, and further comprising:
a mirror disposed on said first end of said optical cavity; and
an anti-reflective coating disposed on said second end of said optical cavity.

21. The laser system of claim 18, wherein said vertical-cavity semiconductor structure includes a first end of an optical cavity and a second end of said optical cavity providing said multi-mode output of said semiconductor device, and further comprising:
a highly reflective mirror disposed on said first end of said optical cavity; and
a partially transmissive mirror disposed on said second end of said optical cavity.

22. The laser system of claim 21, wherein said partially transmissive mirror has a reflectivity at said lasing wavelength of between 25% and 40%.

23. The laser system of claim 22, wherein said highly reflective mirror comprises an interference mirror.

24. The laser system of claim 18, wherein said semiconductor structure includes a plurality of quantum wells having energy levels separated by energies corresponding to said optical wavelength band and spaced according to said lasing wavelength.

25. The laser system of claim 18, wherein said semiconductor structure is optically pumped from a side thereof facing said fiber coupling optics.

26. The laser system of claim 18, wherein an optical distance between a back surface of said vertical cavity semiconductor structure and Bragg grating is at least 1 cm and no more than 5 cm to minimize scrambling of the polarization state of the lasing standing wave of said lasing wavelength.

27. The laser system of claim 17, wherein said semiconductor structure is optically pumped from a side thereof away from said fiber coupling optics.

28. The laser system of claim 17, wherein said Bragg grating is separated from said input end of said optical fiber by no more than 1 cm to minimize scrambling of the polarization state of the lasing standing wave of said lasing wavelength.

29. The laser system of claim 17, wherein said semiconductor device comprises an edge-emitting diode optical amplifier.

30. The laser system of claim 29, wherein said fiber coupling optics comprises an asymmetric fiber taper attached to said end of said single-mode fiber.

31. The semiconductor pump laser system of claim 30, wherein said asymmetric fiber taper is approximately rectangular at least at the multi-mode end.

32. The laser system of claim 17, wherein said Bragg grating has a reflectivity of at least 90%.

33. The semiconductor pump laser system of claim 17, wherein said fiber coupling optics comprises an adiabatic fiber taper tapering from a multi-mode end coupled to said optically active medium to a single-mode end coupled to said optical fiber.

34. The semiconductor pump laser system of claim 33, wherein said adiabatic fiber taper is asymmetric at least at the multi-mode end.

35. The semiconductor pump laser system of claim 34, wherein said adiabatic fiber taper is rectangular at least at the multi-mode end.

* * * * *